(12) United States Patent
Matsumoto et al.

(10) Patent No.: US 11,767,448 B2
(45) Date of Patent: Sep. 26, 2023

(54) POLISHING LIQUID, POLISHING LIQUID SET, AND POLISHING METHOD

(71) Applicant: HITACHI CHEMICAL COMPANY, LTD., Tokyo (JP)

(72) Inventors: Takaaki Matsumoto, Tokyo (JP); Tomohiro Iwano, Tokyo (JP); Tomoyasu Hasegawa, Tokyo (JP); Tomomi Kukita, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 16/981,589

(22) PCT Filed: Mar. 20, 2019

(86) PCT No.: PCT/JP2019/011867
§ 371 (c)(1),
(2) Date: Sep. 16, 2020

(87) PCT Pub. No.: WO2019/182061
PCT Pub. Date: Sep. 26, 2019

(65) Prior Publication Data
US 2021/0054233 A1    Feb. 25, 2021

(30) Foreign Application Priority Data

Mar. 22, 2018   (WO) .................. PCT/JP2018/011464
Jul. 26, 2018   (WO) .................. PCT/JP2018/028105
Sep. 25, 2018   (WO) .................. PCT/JP2018/035480

(51) Int. Cl.
| | | |
|---|---|---|
| C09G 1/02 | (2006.01) | |
| H01L 21/304 | (2006.01) | |
| H01L 21/3105 | (2006.01) | |
| B24B 37/04 | (2012.01) | |
| C09K 13/06 | (2006.01) | |
| B24B 1/00 | (2006.01) | |
| C09G 1/06 | (2006.01) | |
| H01L 21/306 | (2006.01) | |
| C09K 3/14 | (2006.01) | |
| C09G 1/04 | (2006.01) | |
| C09G 1/00 | (2006.01) | |
| H01L 21/321 | (2006.01) | |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/14* (2013.01); *C09K 3/1409* (2013.01); *C09K 3/1454* (2013.01); *C09K 3/1463* (2013.01); *C09K 13/06* (2013.01); *H01L 21/304* (2013.01); *H01L 21/30625* (2013.01); *H01L 21/31053* (2013.01); *H01L 21/31055* (2013.01); *H01L 21/3212* (2013.01)

(58) Field of Classification Search
CPC ........... C09G 1/02; C09G 1/04; H01L 21/304; H01L 21/31055
USPC .......................................................... 438/693
See application file for complete search history.

(56) References Cited

U.S. PATENT DOCUMENTS

| | | |
|---|---|---|
| 5,543,126 A | 8/1996 | Ota |
| 6,939,211 B2 | 9/2005 | Taylor |
| 7,112,123 B2 | 9/2006 | Fang |
| 2004/0065022 A1 | 4/2004 | Machii |
| 2004/0152309 A1 | 8/2004 | Carter |
| 2005/0119360 A1 | 6/2005 | Kawakami |
| 2007/0044385 A1 | 3/2007 | Yamada |
| 2011/0275285 A1 | 11/2011 | Satou |
| 2012/0100718 A1 | 4/2012 | Minami |
| 2012/0129346 A1 | 5/2012 | Ryuzaki |
| 2012/0299158 A1 | 11/2012 | Shinoda |
| 2012/0329371 A1 | 12/2012 | Iwano |
| 2013/0161285 A1* | 6/2013 | Li ...................... C09K 3/1463 216/13 |
| 2015/0140904 A1* | 5/2015 | Iwano .................. H01L 21/304 252/79.1 |
| 2015/0232704 A1 | 8/2015 | Akutsu |
| 2015/0232705 A1 | 8/2015 | Kachi |
| 2016/0024351 A1* | 1/2016 | Yoshida ............... C09K 3/1436 438/692 |
| 2016/0108284 A1 | 4/2016 | Yoshizaki |
| 2016/0137881 A1 | 5/2016 | Oota |
| 2016/0319159 A1 | 11/2016 | Minami |

(Continued)

FOREIGN PATENT DOCUMENTS

| | | |
|---|---|---|
| CN | 103189457 | 7/2013 |
| CN | 103339219 | 10/2013 |

(Continued)

OTHER PUBLICATIONS

Wikipedia, "Tartaric acid" via https://en.wikipedia.org/wiki/Tartaric_acid ; pp. 1-9 (Year: 2021).*
Wikipedia, "Polyethylene glycol" via https://en.wikipedia.org/wiki/Polyethylene_glycol ; pp. 1-11 (Year: 2021).*
Wikipedia, "Poly(N-vinylacetamide)" via https://en.wikipedia.org/wiki/Poly(N-vinylacetamide) ; pp. 1-2 (Year: 2019).*
Wikipedia, "N-vinylpyrrolidone" via https://en.wikipedia.org/wiki/N-Vinylpyrrolidone ; pp. 1-3 (Year: 2020).*
Wikipedia, "Glycolic Acid" via https://en.wikipedia.org/wiki/Glycolic_acid ; pp. 1-5 (Year: 2021).*
Wikipedia, "Lactic acid" via https://en.wikipedia.org/wiki/Lactic_acid ; pp. 1-11 (Year: 2021).*
Wikipedia, "Glyceric acid" via https://en.wikipedia.org/wiki/Glyceric_acid ; pp. 1-2 (Year: 2021).*

(Continued)

*Primary Examiner* — Binh X Tran
(74) *Attorney, Agent, or Firm* — Fitch, Even, Tabin & Flannery, L.L.P.

(57) ABSTRACT

A polishing liquid containing: abrasive grains; a hydroxy acid; a polymer compound having at least one selected from the group consisting of a hydroxyl group and an amide group; and a liquid medium, in which a zeta potential of the abrasive grains is positive, and a weight average molecular weight of the polymer compound is 3000 or more.

29 Claims, No Drawings

(56) References Cited

U.S. PATENT DOCUMENTS

| | | |
|---|---|---|
| 2017/0183537 A1 | 6/2017 | Yoon |
| 2017/0183538 A1 | 6/2017 | Kwon |
| 2017/0292039 A1 | 10/2017 | Sato |
| 2018/0043497 A1 | 2/2018 | Hanano |
| 2018/0072917 A1 | 3/2018 | Kobayashi |
| 2019/0211245 A1* | 7/2019 | Choi .................... C09K 3/1436 |
| 2019/0256742 A1 | 8/2019 | Suzuki |
| 2020/0299544 A1 | 9/2020 | Hanano |
| 2021/0189175 A1 | 6/2021 | Gagliardi |

FOREIGN PATENT DOCUMENTS

| | | |
|---|---|---|
| CN | 104334675 | 2/2015 |
| CN | 105895518 | 8/2016 |
| CN | 108010878 | 5/2018 |
| JP | H8-022970 A | 1/1996 |
| JP | H10-106994 A | 4/1998 |
| JP | 2005513765 | 5/2005 |
| JP | 2006249129 | 9/2006 |
| JP | 2007318072 | 12/2007 |
| JP | 2008112990 | 5/2008 |
| JP | 2009290188 | 12/2009 |
| JP | 2010153781 | 7/2010 |
| JP | 2011518098 | 6/2011 |
| JP | 4941430 | 5/2012 |
| JP | 2012-186339 A | 9/2012 |
| JP | 2013-540851 A | 11/2013 |
| JP | 201593932 | 5/2015 |
| JP | 2015-137297 A | 7/2015 |
| JP | 2016-029123 A | 3/2016 |
| JP | 5943073 | 6/2016 |
| JP | 2016-538359 A | 12/2016 |
| JP | 201752858 | 3/2017 |
| JP | 2017-203076 A | 11/2017 |
| JP | 2018-044046 A | 3/2018 |
| KR | 1020170004462 | 1/2017 |
| KR | 1020170032335 | 3/2017 |
| KR | 101737938 | 5/2017 |
| KR | 1020170097090 | 8/2017 |
| KR | 1020180029888 | 3/2018 |
| TW | 201518489 | 5/2015 |
| TW | 201518492 | 5/2015 |
| TW | 201525118 | 7/2015 |
| TW | 201610126 | 3/2016 |
| TW | 201816060 | 5/2018 |
| WO | 97029510 | 8/1997 |
| WO | 02067309 | 8/2002 |
| WO | 2008146641 | 12/2008 |
| WO | 2009131133 | 10/2009 |
| WO | 2010143579 | 12/2010 |
| WO | 2012070541 | 5/2012 |
| WO | 2012070542 | 5/2012 |
| WO | 2012070544 | 5/2012 |
| WO | 2013125441 | 8/2013 |
| WO | 2014/208414 A1 | 12/2014 |
| WO | 2014199739 | 12/2014 |
| WO | 2015/052988 A1 | 4/2015 |
| WO | 2015/098197 A1 | 7/2015 |
| WO | 2016/006553 A1 | 1/2016 |
| WO | 2016143797 | 9/2016 |
| WO | 201743139 | 3/2017 |
| WO | 2018012174 | 1/2018 |
| WO | 2018048068 | 3/2018 |

OTHER PUBLICATIONS

Merrian Webster Definition of "have" via https://www.merriam-webster.com/dictionary/have ; pp. 1-14 (Year: 2021).*

International Search Report dated Dec. 11, 2018, for International Application No. PCT/JP2018/035456, together with English language translation.

Written Opinion of the International Searching Authority dated Dec. 11, 2018, for International Application No. PCT/JP2018/035456, together with English language translation.

International Search Report dated Aug. 1, 2019, for International Application No. PCT/JP2018/035441, together with English language translation.

Written Opinion of the International Searching Authority dated Aug. 1, 2019, for International Application No. PCT/JP2018/035441, together with English language translation.

International Search Report dated Dec. 25, 2018, for International Application No. PCT/JP2018/035443, together with English language translation.

Written Opinion of the International Searching Authority dated Dec. 25, 2018, for International Application No. PCT/JP2018/035443, together with English language translation.

International Search Report dated Aug. 1, 2019, for International Application No. PCT/ JP2018/035463, together with English language translation.

Written Opinion of the International Searching Authority dated Aug. 1, 2019, for International Application No. PCT/JP2018/035463, together with English language translation.

International Search Report dated Sep. 24, 2019, for International Application No. PCT/ JP2019/028712, together with English language translation.

Written Opinion of the International Searching Authority dated Sep. 27, 2019, for International Application No. PCT/JP2019/028712, together with English language translation.

A. Solt, "13.1 Amino Acids," Chemistry Libre Texts, Chem.Libretext. org, 2021 (Cited in Office Action dated May 25, 2021 in U.S. Appl. No. 16/981,573).

Merricks et al., "Evolution and Revolution of Cerium Oxide Slurries in CMP," Ferro Electronic Material Systems, 2015, pp. 1-6 (Cited in Office Action dated Mar. 10, 2022 in U.S. Appl. No. 16/981,560).

* cited by examiner

POLISHING LIQUID, POLISHING LIQUID SET, AND POLISHING METHOD

CROSS-REFERENCE TO RELATED APPLICATIONS

This application is a U.S. national phase application filed under 35 U.S.C. § 371 of International Application No. PCT/JP2019/011867, filed Mar. 20, 2019, designating the United States, which claims priority from International Application No. PCT/JP2018/035480, filed Sep. 25, 2018, International Application No. PCT/JP2018/028105, filed Jul. 26, 2018, and International Application No. PCT/JP2018/011464, filed Mar. 22, 2018, which are hereby incorporated herein by reference in their entirety.

TECHNICAL FIELD

The present invention relates to a polishing liquid, a polishing liquid set, and a polishing method.

BACKGROUND ART

In recent years, processing techniques for increasing density and miniaturization are becoming ever more important in manufacturing steps for semiconductor elements. CMP (chemical mechanical polishing) technique that is one of processing techniques has become an essential technique in manufacturing steps for semiconductor elements, for a shallow trench isolation (hereinafter, referred to as "STI") formation, flattening of pre-metal insulating materials or interlayer insulating materials, formation of plugs or embedded metal wirings, or the like.

As a polishing liquid most frequently used, for example, a silica-based polishing liquid containing silica (silicon oxide) particles such as fumed silica or colloidal silica as abrasive grains is exemplified. The silica-based polishing liquid is characterized by being high in general versatility, and can polish broad types of materials irrespective of insulating materials and conductive materials by appropriately selecting an abrasive grain content, a pH, an additive, or the like.

Meanwhile, as a polishing liquid mainly used for insulating materials such as silicon oxide, a demand for a polishing liquid containing cerium compound particles as abrasive grains is also increasing. For example, a cerium oxide based polishing liquid containing cerium oxide particles as abrasive grains can polish silicon oxide at a high rate even when the abrasive grain content is lower than that in the silica-based polishing liquid (for example, see Patent Literatures 1 and 2 described below).

CITATION LIST

Patent Literature

Patent Literature 1: Japanese Unexamined Patent Publication No. H10-106994
Patent Literature 2: Japanese Unexamined Patent Publication No. H08-022970

SUMMARY OF INVENTION

Technical Problem

In recent years, in the process of manufacturing a semiconductor element, polishing scratches generated at the time of polishing become problematic. As a method of reducing polishing scratches, a method of decreasing the content of the abrasive grains at the time of polishing, a method of decreasing the size of the abrasive grains (for example, a method of decreasing coarse particles of 1 µm or more), a method of lowering a load at the time of polishing, and the like are exemplified. However, in these methods, a problem arises in that the mechanical action at the time of polishing is decreased, and thereby a polishing rate for an insulating material is lowered.

Therefore, in recent years, in order to enhance reactivity between abrasive grains and an insulating material to improve a polishing rate, abrasive grains having a positive zeta potential (cationic abrasive grains) have come to be used. In comparison between abrasive grains having the same size, abrasive grains having a positive zeta potential tend to have a higher polishing rate for an insulating material than that of abrasive grains having a negative zeta potential. However, in the case of using abrasive grains having a positive zeta potential, the abrasive grains are likely to remain on a polished surface after polishing, and thereby a problem arises in that washability is poor. The abrasive grains remaining on the polished surface after polishing become one of causes of lowering a yield of a device similarly to polishing scratches. Therefore, a polishing liquid containing abrasive grains having a positive zeta potential is required to be excellent in washability of a polished surface after polishing.

The present invention is made to solve the above-described problems, and an object thereof is to provide a polishing liquid, a polishing liquid set, and a polishing method which are excellent in washability of a polished surface after polishing.

Solution to Problem

A polishing liquid of an aspect of the present invention contains abrasive grains, a hydroxy acid, a polymer compound having at least one selected from the group consisting of a hydroxyl group and an amide group, and a liquid medium, in which a zeta potential of the abrasive grains is positive, and a weight average molecular weight of the polymer compound is 3000 or more.

According to such a polishing liquid, remaining of the abrasive grains on a polished surface after polishing can be suppressed, and washability of the polished surface after polishing is excellent. According to such a polishing liquid, residual abrasive grains after polishing are reduced, and thereby a yield of a device can be improved.

A polishing liquid set of another aspect of the present invention contains constituent components of the above-described polishing liquid separately stored as a first liquid and a second liquid, in which the first liquid contains the abrasive grains and a liquid medium, and the second liquid contains the hydroxy acid, the polymer compound, and a liquid medium. According to such a polishing liquid set, the same effect as that of the above-described polishing liquid can be obtained.

A polishing method of another aspect of the present invention includes a polishing step of polishing a surface to be polished by using the above-described polishing liquid or a polishing liquid obtained by mixing the first liquid and the second liquid of the above-described polishing liquid set. According to such a polishing method, the same effect as that of the above-described polishing liquid can be obtained.

Advantageous Effects of Invention

According to the present invention, it is possible to provide a polishing liquid which is excellent in washability of a polished surface after polishing. According to the present invention, it is possible to provide a polishing liquid set for obtaining the above-described polishing liquid. According to the present invention, it is possible to provide a polishing method which uses the above-described polishing liquid or the above-described polishing liquid set.

According to the present invention, it is possible to provide use of a polishing liquid or a polishing liquid set in a flattening step of a base substrate surface. According to the present invention, it is possible to provide use of a polishing liquid or a polishing liquid set in a flattening step of STI insulating materials, pre-metal insulating materials, or interlayer insulating materials.

DESCRIPTION OF EMBODIMENTS

Hereinafter, embodiments of the present invention will be described in detail. However, the present invention is not limited to the following embodiments.
<Definition>
In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specified. In the present specification, when a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

In the present specification, the term "polishing liquid" (abrasive) is defined as a composition to be brought into contact with a surface to be polished, at the time of polishing. The term "polishing liquid" itself does not limit any components contained in the polishing liquid. As described later, a polishing liquid of the present embodiment contains abrasive grains. While the abrasive grains are also referred to as "polishing particles" (abrasive particle), it is referred to as "abrasive grains" in the present specification. The abrasive grains are generally solid particles, and it is considered that a subject to be removed is removed by a mechanical action (physical action) of the abrasive grains and a chemical action of the abrasive grains (mainly surfaces of the abrasive grains) at the time of polishing, but the mechanism is not limited thereto.
<Polishing Liquid and Polishing Liquid Set>
A polishing liquid of the present embodiment is, for example, a polishing liquid for CMP. The polishing liquid of the present embodiment contains abrasive grains, a hydroxy acid, a polymer compound containing at least one selected from the group consisting of a hydroxyl group and an amide group (hereinafter, referred to as the "polymer compound A"), and a liquid medium, in which a zeta potential of the abrasive grains is positive, and a weight average molecular weight of the polymer compound A is 3000 or more.

According to the present embodiment, remaining of the abrasive grains on a polished surface after polishing can be suppressed, and washability of the polished surface after polishing (hereinafter, simply referred to as "washability" depending on circumstances) is excellent. According to the present embodiment, residual abrasive grains after polishing are reduced, and thereby a yield of a device can be improved. According to the present embodiment, without using a poisonous material such as hydrofluoric acid for removing the abrasive grains from a polished surface after polishing, the abrasive grains can be removed by using an alkali liquid such as ammonia. The reasons why excellent washability is obtained in this way are, for example, the reasons to be as follows. However, the reasons are not limited to the reasons to be as follows.

That is, the polymer compound A containing at least one selected from the group consisting of a hydroxyl group and an amide group is brought into contact with the abrasive grains having a positive zeta potential, and thereby the value of the zeta potential is decreased. Further, when the weight average molecular weight of the polymer compound A is 3000 or more, the polymer compound A is likely to cover the abrasive grains, and thus the value of the zeta potential is likely to be decreased. In this case, the adsorptive property (reactivity) of the abrasive grains with respect to an insulating material that tends to have a negative electrical charge is likely to be lowered.

Further, by using the polymer compound A, wettability of the polished surface with respect to a washing liquid to be used in a washing step is improved. Furthermore, when the hydroxy acid is used, the hydroxy acid is adsorbed to the abrasive grains to improve hydrophilicity, and thereby affinity between the abrasive grains and the washing liquid is improved.

As described above, according to the present embodiment, it is speculated that the abrasive grains are easily removed in the washing step after polishing, and thus excellent washability is obtainable.

Further, according to the present embodiment, by using the polymer compound A, wettability of a polishing pad and a surface to be polished with respect to the polishing liquid is improved. According to this, since the polishing liquid hardly remains between the polishing pad and the surface to be polished, the amount of the abrasive grains remaining after the completion of polishing can also be decreased as compared to the case of not using the polymer compound A.

According to the present embodiment, excellent washability can be obtained while an excellent polishing rate is obtained. Furthermore, according to the present embodiment, even in the case of using, as a method of reducing polishing scratches, a method of decreasing the content of the abrasive grains at the time of polishing, a method of decreasing the size of the abrasive grains (for example, a method of decreasing coarse particles of 1 μm or more), a method of lowering a load at the time of polishing, or the like, excellent washability can be obtained while polishing scratches are reduced and an excellent polishing rate is obtained.

(Abrasive Grains)

The polishing liquid of the present embodiment contains abrasive grains having a positive zeta potential in the polishing liquid. The abrasive grains preferably contain at least one selected from the group consisting of a cerium oxide (ceria (cerium oxide (IV)) or the like), silica, alumina, zirconia, yttria, and a hydroxide of a tetravalent metal element and more preferably contain a cerium oxide, from the viewpoint of easily polishing an insulating material at a high polishing rate. The abrasive grains can be used singly or in combinations of two or more.

The "hydroxide of a tetravalent metal element" is a compound containing a tetravalent metal ($M^{4+}$) and at least one hydroxide ion ($OH^-$). The hydroxide of a tetravalent metal element may contain an anion (for example, nitrate ion $NO_3^-$ and a sulfate ion $SO_4^{2-}$) other than a hydroxide ion. For example, the hydroxide of a tetravalent metal element may contain an anion (for example, a nitrate ion $NO_3^-$ and a sulfate ion $SO_4^{2-}$) bound to the tetravalent metal element. The hydroxide of a tetravalent metal element can be prepared by reacting a salt (metal salt) of a tetravalent metal element with an alkali source (base).

The hydroxide of a tetravalent metal element preferably contains cerium hydroxide (hydroxide of tetravalent cerium) from the viewpoint of easily improving the polishing rate for an insulating material. The cerium hydroxide can be prepared by reacting a cerium salt with an alkali source (base). The cerium hydroxide is preferably prepared by mixing a cerium salt with an alkali liquid (for example, alkali aqueous solution). This makes it possible to obtain particles having an extremely fine particle diameter, and easily obtain an excellent effect of reducing polishing scratches. The cerium hydroxide can be obtained by mixing a cerium salt solution (for example, cerium salt aqueous solution) with alkali liquid. Examples of cerium salt include $Ce(NO_3)_4$, $Ce(SO_4)_2$, $Ce(NH_4)_2(NO_3)_6$, and $Ce(NH_4)_4(SO_4)_4$.

It is considered that particles including $Ce(OH)_aX_b$ (in the formula, a+b×c=4) made of tetravalent cerium ($Ce^{4+}$), one to three hydroxide ions ($OH^-$), and one to three anions ($X^{c-}$) are generated (incidentally, such particles are also cerium hydroxide) depending on production conditions of cerium hydroxide and the like. It is considered that, in $Ce(OH)_aX_b$, an electron-withdrawing anion ($X^{c-}$) acts to enhance reactivity of the hydroxide ion and the polishing rate is improved with the increase in abundance of $Ce(OH)_aX_b$. Examples of the anions ($X^{c-}$) include $NO_3^-$ and $SO_4^{2-}$. It is considered that the particles containing cerium hydroxide can contain not only $Ce(OH)_aX_b$ but also $Ce(OH)_4$, $CeO_2$, or the like.

The containing of $Ce(OH)_aX_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by XPS method (X-ray Photoelectron Spectroscopy).

In a case where the abrasive grains contain a cerium oxide, the lower limit of the content of the cerium oxide is preferably 50% by mass or more, more preferably more than 50% by mass, further preferably 60% by mass or more, particularly preferably 70% by mass or more, extremely preferably 80% by mass or more, highly preferably 90% by mass or more, even more preferably 95% by mass or more, more preferably 98% by mass or more, and further preferably 99% by mass or more, on the basis of the whole abrasive grains (the whole abrasive grains contained in the polishing liquid; the same applies hereinafter), from the viewpoint of further improving the polishing rate for an insulating material. These numerical ranges may be satisfied in an embodiment where the abrasive grains do not contain composite particles described later.

The lower limit of the average particle diameter of the abrasive grains in the polishing liquid or a slurry of the polishing liquid set described later is preferably 16 nm or more, more preferably 20 nm or more, further preferably 30 nm or more, particularly preferably 40 nm or more, extremely preferably 50 nm or more, highly preferably more than 50 nm, even more preferably 100 nm or more, more preferably 120 nm or more, and further preferably 140 nm or more, from the viewpoint of easily improving the polishing rate for an insulating material. The upper limit of the average particle diameter of the abrasive grains is preferably 1050 nm or less, more preferably 1000 nm or less, further preferably 800 nm or less, particularly preferably 600 nm or less, extremely preferably 500 nm or less, highly preferably 400 nm or less, even more preferably 300 nm or less, more preferably 200 nm or less, further preferably 160 nm or less, and particularly preferably 155 nm or less, from the viewpoint of easily suppressing scratches on a polished surface. From these viewpoints, the average particle diameter of the abrasive grains is more preferably 16 to 1050 nm and further preferably 20 to 1000 nm.

The average particle diameter can be measured using an optical diffraction scattering particle size distribution meter (for example, trade name: N5 manufactured by Beckman Coulter, Inc., or trade name: Microtrac MT3300EXII manufactured by MicrotracBEL Corp.).

The zeta potential (surface potential) of the abrasive grains in the polishing liquid is positive (the zeta potential exceeds 0 mV) from the viewpoint that washability of the polished surface after polishing is excellent (remaining of the abrasive grains on a polished surface after polishing is suppressed). The lower limit of the zeta potential of the abrasive grains is preferably 10 mV or more, more preferably 20 mV or more, further preferably 25 mV or more, particularly preferably 30 mV or more, extremely preferably 40 mV or more, and highly preferably 50 mV or more, from the viewpoint of easily obtaining excellent washability. The upper limit of the zeta potential of the abrasive grains is not particularly limited, but is preferably 200 mV or less. From these viewpoints, the zeta potential of the abrasive grains is more preferably 10 to 200 mV.

The zeta potential of the abrasive grains can be measured, for example, by using a dynamic light scattering type zeta potential measurement apparatus (for example, trade name: DelsaNano C manufactured by Beckman Coulter, Inc.). The zeta potential of the abrasive grains can be adjusted using an additive. For example, by bringing a monocarboxylic acid (acetic acid or the like) into contact with abrasive grains containing a cerium oxide, abrasive grains having a positive zeta potential can be obtained. Also, by bringing ammonium dihydrogen phosphate, a material having a carboxyl group (polyacrylic acid or the like) or the like into contact with abrasive grains containing a cerium oxide, abrasive grains having a negative zeta potential can be obtained.

The lower limit of the content of the abrasive grains is preferably 0.005% by mass or more, more preferably more than 0.005% by mass, further preferably 0.01% by mass or more, particularly preferably 0.02% by mass or more, extremely preferably 0.03% by mass or more, highly preferably 0.04% by mass or more, even more preferably 0.05% by mass or more, more preferably 0.07% by mass or more, and further preferably 0.1% by mass or more, on the basis of the total mass of the polishing liquid, from the viewpoint of easily improving the polishing rate for an insulating material. The upper limit of the content of the abrasive grains is preferably 20% by mass or less, more preferably 15% by mass or less, further preferably 10% by mass or less, particularly preferably 5% by mass or less, extremely preferably 4% by mass or less, highly preferably 3% by mass or less, even more preferably 1% by mass or less, more preferably 0.5% by mass or less, further preferably 0.3% by mass or less, and particularly preferably 0.2% by mass or less, on the basis of the total mass of the polishing liquid, from the viewpoint of easily obtaining excellent washability. From these viewpoints, the content of the abrasive grains is more preferably 0.005 to 20% by mass on the basis of the total mass of the polishing liquid.

The abrasive grains may include composite particles composed of a plurality of particles in contact with each other. For example, the abrasive grains may include composite particles including first particles and second particles in contact with the first particles or may include composite particles and free particles (for example, second particles not in contact with first particles).

The abrasive grains may be an embodiment including first particles and second particles in contact with the first particles, in which the particle diameter of the second particles is smaller than the particle diameter of the first particles, the first particles contain a cerium oxide, and the second particles contain a cerium compound, as an embodiment including composite particles. By using such abrasive grains, the polishing rate for an insulating material (for example, silicon oxide) is easily improved. The reasons why the polishing rate for an insulating material is improved in this way are, for example, the reasons to be as follows. However, the reasons are not limited to the reasons to be as follows.

That is, the first particles containing a cerium oxide and having a larger particle diameter than that of the second particles have strong mechanical action (mechanical property) with respect to an insulating material as compared to the second particles. On the other hand, the second particles containing a cerium compound and having a smaller particle diameter than that of the first particles have small mechanical action with respect to an insulating material as compared to the first particles, but have strong chemical action (chemical property) with respect to an insulating material since the specific surface area (surface area per unit mass) in the whole particle is large. Therefore, a synergetic effect of improving the polishing rate is easily obtained by using the first particles having strong mechanical action and the second particles having strong chemical action.

Examples of the cerium compound of the second particles include cerium hydroxide and a cerium oxide. As the cerium compound of the second particles, a compound different from a cerium oxide can be used. The cerium compound preferably contains cerium hydroxide from the viewpoint of easily improving the polishing rate for an insulating material.

The particle diameter of the second particles is preferably smaller than the particle diameter of the first particles. The magnitude relationship in particle diameter between the first particles and the second particles can be determined from SEM images of the composite particle, or the like. In general, particles having a small particle diameter have a larger surface area per unit mass than that of particles having a large particle diameter, and thus have higher reaction activity. On the other hand, the mechanical action (mechanical polishing force) of particles having a small particle diameter is smaller than that of particles having a large particle diameter. However, in the present embodiment, even in a case where the particle diameter of the second particles is smaller than the particle diameter of the first particles, the synergetic effect of the first particles and the second particles can be expressed and both of excellent reaction activity and excellent mechanical action can be achieved.

The lower limit of the particle diameter of the first particles is preferably 15 nm or more, more preferably 25 nm or more, further preferably 35 nm or more, particularly preferably 40 nm or more, extremely preferably 50 nm or more, highly preferably 80 nm or more, and even more preferably 100 nm or more, from the viewpoint of easily improving the polishing rate for an insulating material. The upper limit of the particle diameter of the first particles is preferably 1000 nm or less, more preferably 800 nm or less, further preferably 600 nm or less, particularly preferably 400 nm or less, extremely preferably 300 nm or less, highly preferably 200 nm or less, and even more preferably 150 nm or less, from the viewpoint of easily obtaining excellent washability and the viewpoint of easily suppressing scratches at a polished surface. From these viewpoints, the particle diameter of the first particles is more preferably 15 to 1000 nm. The average particle diameter (average secondary particle diameter) of the first particles may be in the above ranges.

The lower limit of the particle diameter of the second particles is preferably 1 nm or more, more preferably 2 nm or more, and further preferably 3 nm or more, from the viewpoint of easily improving the polishing rate for an insulating material. The upper limit of the particle diameter of the second particles is preferably 50 nm or less, more preferably 30 nm or less, further preferably 25 nm or less, particularly preferably 20 nm or less, extremely preferably 15 nm or less, and highly preferably 10 nm or less, from the viewpoint of easily obtaining excellent washability and the viewpoint of easily suppressing scratches at a polished surface. From these viewpoints, the particle diameter of the second particles is more preferably 1 to 50 nm. The average particle diameter (average secondary particle diameter) of the second particles may be in the above ranges.

The first particles can have a negative zeta potential. The second particles can have a positive zeta potential.

As the embodiment including composite particles and free particles described above, when an aqueous dispersion (a mixture composed of abrasive grains and water) having the content of the abrasive grains adjusted to 1.0% by mass is subjected to centrifugal separation at a centrifugal acceleration of $5.8 \times 10^4$ G for 5 minutes, the abrasive grains preferably produce a liquid phase (supernatant solution) in which an absorbance for light having a wavelength of 380 nm is more than 0. In this case, the polishing rate for an insulating material (for example, silicon oxide) is easily improved.

The reasons why the polishing rate is improved in this way are, for example, the reasons to be as follows. However, the reasons are not limited to the reasons to be as follows.

That is, in a case where the absorbance for light having a wavelength of 380 nm is more than 0 in a liquid phase obtained when the aqueous dispersion is subjected to centrifugal separation, in such centrifugal separation, the composite particles are easily selectively removed and a liquid phase containing free particles as the solid content is obtainable, and in a case where the absorbance is more than 0, the abrasive grains contain free particles in addition to the composite particles. Since the free particles have a smaller particle diameter than that of the composite particles, the free particles have a high diffusion rate and are preferentially adsorbed to a surface of an insulating material to coat the surface. In this case, as well as acting directly on the insulating material, the composite particles also act on the free particles adsorbed to the insulating material to act indirectly on the insulating material (for example, the physical action can be transferred to the insulating material through the free particles adsorbed to the insulating material). According to this, it is speculated that the polishing rate for an insulating material is easily improved.

The above-described absorbance for light having a wavelength of 380 nm is preferably in the following range. The lower limit of the absorbance is preferably 0.001 or more, more preferably 0.0015 or more, and further preferably 0.002 or more, from the viewpoint of easily further improving the polishing rate for an insulating material. In a case where the content of free particles is large, it is speculated that the amount of adsorption of free particles with respect to the insulating material is increased, and thus the polishing rate for an insulating material is easily further improved. The upper limit of the absorbance is preferably 0.5 or less, more preferably 0.4 or less, further preferably 0.3 or less, particularly preferably 0.25 or less, and extremely preferably 0.2 or less, from the viewpoint of easily further improving the polishing rate for an insulating material. From the above-described viewpoint, the absorbance is more preferably more than 0 and 0.5 or less. The above-described absorbance can be adjusted by adjusting the content of free particles in the abrasive grains. For example, the above-described absorbance can be decreased by increasing the surface area of the first particles with which the second particles are in contact, adjusting a state to an insufficient dispersion state when the first particles and the second particles are brought into contact with each other (by decreasing a dispersion time, decreasing the number of rotations in stirring of a liquid containing the first particles and the second particles, weakening electrostatic repulsion generated between particles, or the like), and the like.

In the present embodiment, the abrasive grains in which the above-described absorbance for light having a wavelength of 380 nm is 0 may be used. Such abrasive grains can be obtained by removing free particles by centrifugal separation.

From the viewpoint of easily further improving the polishing rate for an insulating material (for example, silicon oxide), when an aqueous dispersion (a mixture composed of the abrasive grains and water) having the content of the abrasive grains adjusted to 1.0% by mass is subjected to centrifugal separation at a centrifugal acceleration of 5.8× $10^4$ G for 5 minutes, the abrasive grains preferably produce a liquid phase (supernatant solution) in which a light transmittance for light having a wavelength of 500 nm is in the following range. The lower limit of the light transmittance is preferably 50%/cm or more, more preferably 60%/cm or more, further preferably 70%/cm or more, particularly preferably 80%/cm or more, extremely preferably 90%/cm or more, and highly preferably 92%/cm or more. The upper limit of the light transmittance is 100%/cm.

The composite particles including the first particles and the second particles can be obtained, for example, by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like.

The lower limit of the content of the cerium oxide in the first particles is preferably 50% by mass or more, more preferably 70% by mass or more, further preferably 90% by mass or more, and particularly preferably 95% by mass or more, on the basis of the whole first particles (the whole first particles contained in the polishing liquid; the same applies hereinafter), from the viewpoint of easily improving the polishing rate for an insulating material. The first particles may be an embodiment substantially composed of a cerium oxide (an embodiment in which 100% by mass of the first particles are substantially a cerium oxide).

The lower limit of the content of the cerium compound in the second particles is preferably 50% by mass or more, more preferably 70% by mass or more, further preferably 90% by mass or more, and particularly preferably 95% by mass or more, on the basis of the whole second particles (the whole second particles contained in the polishing liquid; the same applies hereinafter), from the viewpoint of easily improving the polishing rate for an insulating material. The second particles may be an embodiment substantially composed of a cerium compound (an embodiment in which 100% by mass of the second particles are substantially a cerium compound).

The content of the second particles can be estimated on the basis of a value of absorbance of equation below which is obtained by a spectrophotometer when light having a specific wavelength is transmitted through the polishing liquid. That is, in a case where particles absorb light having a specific wavelength, the light transmittance of a region containing the particles is decreased. The light transmittance is decreased not only by absorption of the particles but also by scattering, but in the second particles, the influence of scattering is small. Therefore, in present embodiment, the content of the second particles can be estimated on the basis of a value of absorbance calculated by equation below.

Absorbance=-$LOG_{10}$(Light transmittance [%]/100)

The content of the first particles in the abrasive grains including the composite particles is preferably in the following range on the basis of the whole abrasive grains. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of easily improving the polishing rate for an insulating material. The upper limit of the content of the first particles is preferably 95% by mass or less, more preferably 93% by mass or less, and further preferably 91% by mass or less, from the viewpoint of easily improving the polishing rate for an insulating material. From these viewpoints, the content of the first particles is more preferably 50 to 95% by mass.

The content of the second particles in the abrasive grains including the composite particles is preferably in the following range on the basis of the whole abrasive grains. The lower limit of the content of the second particles is preferably 5% by mass or more, more preferably 7% by mass or more, and further preferably 9% by mass or more, from the viewpoint of easily improving the polishing rate for an insulating material. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of easily improving the polishing rate for an insulating material. From these viewpoints, the content of the second particles is more preferably 5 to 50% by mass.

The content of the cerium oxide in the abrasive grains including the composite particles is preferably in the following range on the basis of the whole abrasive grains. The lower limit of the content of the cerium oxide is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of easily improving the polishing rate for an insulating material. The upper limit of the content of the cerium oxide is preferably 95% by mass or less, more preferably 93% by mass or less, and further preferably 91% by mass or less, from the viewpoint of easily improving the polishing rate for an insulating material. From these viewpoints, the content of the cerium oxide is more preferably 50 to 95% by mass.

The content of the cerium hydroxide in the abrasive grains including the composite particles is preferably in the following range on the basis of the whole abrasive grains. The lower limit of the content of the cerium hydroxide is preferably 5% by mass or more, more preferably 7% by mass or more, and further preferably 9% by mass or more, from the viewpoint of easily improving the polishing rate for an insulating material. The upper limit of the content of the cerium hydroxide is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of easily improving the polishing rate for an insulating material. From these viewpoints, the content of the cerium hydroxide is more preferably 5 to 50% by mass.

The content of the first particles is preferably in the following range on the basis of the total amount of the first particles and the second particles. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and more preferably 90% by mass or more, from the viewpoint of easily improving the polishing rate for an insulating material. The upper limit of the content of the first particles is preferably 95% by mass or less, more preferably 93% by mass or less, and further preferably 91% by mass or less, from the viewpoint of easily improving the polishing rate for an insulating material. From these viewpoints, the content of the first particles is more preferably 50 to 95% by mass.

The content of the second particles is preferably in the following range on the basis of the total amount of the first particles and the second particles. The lower limit of the content of the second particles is preferably 5% by mass or more, more preferably 7% by mass or more, and further preferably 9% by mass or more, from the viewpoint of easily improving the polishing rate for an insulating material. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, even more preferably 15% by mass or less, and more preferably 10% by mass or less, from the viewpoint of easily improving the polishing rate for an insulating material. From these viewpoints, the content of the second particles is more preferably 5 to 50% by mass.

The content of the first particles in the polishing liquid is preferably in the following range on the basis of the total mass of the polishing liquid. The lower limit of the content of the first particles is preferably 0.005% by mass or more, more preferably 0.008% by mass or more, further preferably 0.01% by mass or more, particularly preferably 0.05% by mass or more, extremely preferably 0.08% by mass or more, and highly preferably 0.09% by mass or more, from the viewpoint of easily improving the polishing rate for an insulating material. The upper limit of the content of the first particles is preferably 5% by mass or less, more preferably 3% by mass or less, further preferably 1% by mass or less, particularly preferably 0.5% by mass or less, extremely preferably 0.3% by mass or less, highly preferably 0.2% by mass or less, and even more preferably 0.1% by mass or less, from the viewpoint of easily enhancing the storage stability of the polishing liquid. From these viewpoints, the content of the first particles is more preferably 0.005 to 5% by mass.

The content of the second particles in the polishing liquid is preferably in the following range on the basis of the total mass of the polishing liquid. The lower limit of the content of the second particles is preferably 0.005% by mass or more, more preferably 0.008% by mass or more, and further preferably 0.009% by mass or more, from the viewpoints of further improving the chemical interaction between the abrasive grains and a surface to be polished and easily improving the polishing rate for an insulating material. The upper limit of the content of the second particles is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, more preferably 0.035% by mass or less, further preferably 0.03% by mass or less, particularly preferably 0.02% by mass or less, and extremely preferably 0.01% by mass or less, from the viewpoints of easily avoiding the aggregation of the abrasive grains, and easily obtaining more favorable chemical interaction between the abrasive grains and a surface to be polished to easily utilize the properties of the abrasive grains effectively. From these viewpoints, the content of the second particles is more preferably 0.005 to 5% by mass.

The content of the cerium oxide in the polishing liquid containing the abrasive grains including the composite particles is preferably in the following range on the basis of the total mass of the polishing liquid. The lower limit of the content of the cerium oxide is preferably 0.005% by mass or more, more preferably 0.008% by mass or more, further preferably 0.01% by mass or more, particularly preferably 0.05% by mass or more, extremely preferably 0.08% by mass or more, and highly preferably 0.09% by mass or more, from the viewpoint of easily improving the polishing rate for an insulating material. The upper limit of the content of the cerium oxide is preferably 5% by mass or less, more preferably 3% by mass or less, further preferably 1% by mass or less, particularly preferably 0.5% by mass or less, extremely preferably 0.3% by mass or less, highly preferably 0.2% by mass or less, and even more preferably 0.1% by mass or less, from the viewpoint of easily enhancing the storage stability of the polishing liquid. From these viewpoints, the content of the cerium oxide is more preferably 0.005 to 5% by mass.

The content of the cerium hydroxide in the polishing liquid containing the abrasive grains including the composite particles is preferably in the following range on the basis of the total mass of the polishing liquid. The lower limit of the content of the cerium hydroxide is preferably 0.005% by mass or more, more preferably 0.008% by mass or more, and further preferably 0.009% by mass or more, from the viewpoints of further improving the chemical interaction between the abrasive grains and a surface to be polished and easily improving the polishing rate for an insulating material. The upper limit of the content of the cerium hydroxide is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, more preferably 0.035% by mass or less, further preferably 0.03% by mass or less, particularly preferably 0.02% by mass or less, and extremely preferably 0.01% by mass or less, from the viewpoints of easily avoiding the aggregation of the abrasive grains, and easily obtaining more favorable chemical interaction between the abrasive grains and a surface to be polished to easily utilize the properties of the abrasive grains effectively. From these viewpoints, the content of the cerium hydroxide is more preferably 0.005 to 5% by mass.

(Additive)

The polishing liquid of the present embodiment contains an additive. Here, "additive" refers to a substance that is contained in the polishing liquid in addition to the abrasive grains and a liquid medium.

[Hydroxy Acid]

The polishing liquid of the present embodiment contains a hydroxy acid (excluding a compound corresponding to the polymer compound A). A hydroxy acid has at least one carboxyl group and at least one hydroxyl group. "—OH" in a carboxyl group is not included in the "hydroxyl group". The "hydroxyl group" may be either an alcoholic hydroxyl group or a phenolic hydroxyl group. The hydroxy acid may not have a phenolic hydroxyl group.

The hydroxy add preferably have one carboxyl group and one to three hydroxyl group (for example, a an alcoholic hydroxyl group) from the viewpoint of easily obtaining excellent washability. The number of hydroxyl groups in the hydroxy acid is preferably one or two and more preferably two, from the viewpoint of easily obtaining excellent washability. The number of hydroxyl groups in the hydroxy acid may be two or three.

Examples of the hydroxy acid include glycolic acid, glyceric acid, lactic acid (for example, DL-lactic acid), 2,2-bis(hydroxymethyl)propionic acid, 2,2-bis(hydroxymethyl)butyric acid, 2-hydroxyisobutyric acid (another name: 2-methyllactic acid), N,N-bis(2-hydroxyethyl)glycine, N-[2-hydroxy-1,1-bis(hydroxymethyl)ethyl]glycine, bicin, tricine, tyrosine, serine, and threonine. The hydroxy acid preferably contains at least one selected from the group consisting of lactic acid (for example, DL-lactic acid), 2,2-bis(hydroxymethyl)propionic acid, 2,2-bis(hydroxymethyl)butyric acid, N,N-bis(2-hydroxyethyl)glycine, and N-[2-hydroxy-1,1-bis(hydroxymethyl)ethyl] glycine, more preferably contains at least one selected from the group consisting of 2,2-bis(hydroxymethyl)propionic acid and 2,2-bis(hydroxymethyl)butyric acid, further preferably contains 2,2-bis(hydroxymethyl)propionic acid, from the viewpoint of easily obtaining excellent washability and an excellent polishing rate.

The hydroxy acid preferably contains an aliphatic hydroxy acid from the viewpoint of easily obtaining excellent washability. The hydroxy acid may contain a hydroxy acid containing a nitrogen atom or may contain a hydroxy acid not containing a nitrogen atom. The hydroxy acid may have an amino group or may not have an amino group. The hydroxy acid may contain an amino acid or may not contain an amino acid.

The polishing liquid of the present embodiment may contain a hydroxy acid other than the hydroxy acid having one carboxyl group and one to three hydroxyl group. Examples of such a hydroxy acid include a hydroxy acid having two or more carboxyl groups and a hydroxy acid having four or more hydroxyl groups. Specific examples thereof include glucuronic acid, gluconic acid, citric acid, and tartaric acid.

The upper limit of the hydroxyl value of the hydroxy acid is preferably 1500 or less, more preferably 1300 or less, further preferably 1100 or less, particularly preferably 1000 or less, and extremely preferably 900 or less, from the viewpoint of easily obtaining excellent washability. The lower limit of the hydroxyl value of the hydroxy acid is preferably 50 or more, more preferably 150 or more, further preferably 250 or more, particularly preferably 500 or more, extremely preferably 600 or more, and highly preferably 650 or more, from the viewpoint of easily obtaining excellent washability. From these viewpoints, the hydroxyl value of the hydroxy acid is more preferably 50 to 1500. The "hydroxyl value" is a numerical value which serves as a measure of the number of hydroxyl groups contained in the hydroxy acid, and is calculated from equation (1) below.

$$\text{Hydroxyl value} = 56110 \times \text{Number of hydroxyl groups} / \text{Molecular weight} \quad (1)$$

The lower limit of the content of the hydroxy acid is preferably 0.001% by mass or more, more preferably 0.003% by mass or more, further preferably 0.005% by mass or more, particularly preferably 0.008% by mass or more, extremely preferably 0.01% by mass or more, highly preferably 0.03% by mass or more, even more preferably 0.05% by mass or more, more preferably 0.08% by mass or more, further preferably 0.1% by mass or more, particularly preferably 0.2% by mass or more, extremely preferably 0.3% by mass or more, and highly preferably 0.4% by mass or more, on the basis of the total mass of the polishing liquid, from the viewpoint of easily obtaining excellent washability. The upper limit of the content of the hydroxy acid is preferably 1.0% by mass or less, more preferably 0.8% by mass or less, and further preferably 0.5% by mass or less, on the basis of the total mass of the polishing liquid, from the viewpoint of easily obtaining an excellent polishing rate. From these viewpoints, the content of the hydroxy acid is more preferably 0.001 to 1.0% by mass and further preferably 0.01 to 1.0% by mass on the basis of the total mass of the polishing liquid.

The lower limit of the content of the hydroxy acid is preferably 10 parts by mass or more, more preferably 20 parts by mass or more, further preferably 30 parts by mass or more, and particularly preferably 40 parts by mass or more, with respect to 100 parts by mass of the abrasive grains, from the viewpoint of easily obtaining excellent washability. The upper limit of the content of the hydroxy acid is preferably 100 parts by mass or less, more preferably less than 100 parts by mass, further preferably 80 parts by mass or less, particularly preferably 70 parts by mass or less, extremely preferably 60 parts by mass or less, and highly preferably 50 parts by mass or less, with respect to 100 parts by mass of the abrasive grains, from the viewpoint of easily obtaining an excellent polishing rate. From these viewpoints, the content of the hydroxy acid is more preferably 10 to 100 parts by mass with respect to 100 parts by mass of the abrasive grains.

The lower limit of the content of the hydroxy acid having one carboxyl group and one to three hydroxyl group is preferably 50% by mass or more, more preferably 70% by mass or more, further preferably 90% by mass or more, particularly preferably 95% by mass or more, extremely preferably 97% by mass or more, and highly preferably 99% by mass or more, on the basis of the total mass of a hydroxy acid contained in the polishing liquid, from the viewpoint of easily obtaining excellent washability.

[Polymer Compound A]

The polishing liquid of the present embodiment contains the polymer compound A having at least one selected from the group consisting of a hydroxyl group and an amide group. As the polymer compound A, a water-soluble polymer can be used. The "water-soluble polymer" is defined as a polymer which is dissolved in 100 g of water in an amount of 0.1 g or more (the same applies hereinafter).

The polymer compound A preferably contains a polyol as the polymer compound having a hydroxyl group, from the viewpoint of easily obtaining excellent washability. A polyol is a compound having two or more hydroxy groups in the molecule. The polymer compound A may contain a polyether polyol (a polymer compound having a polyether structure) as the polymer compound having a hydroxyl group, from the viewpoint that it is easy to form a protective layer on a surface to be polished to moderately adjust the polishing rate, and thus, excessive polishing of the concave portion is easily suppressed, and therefore, it is easy to flatly finish a wafer after polishing.

Examples of the polymer compound A having a hydroxyl group include polyglycerin, polyvinyl alcohol, polyalkylene glycol (polyethylene glycol or the like), polyoxyalkylene glycol, polyoxyalkylene sorbitol ether (polyoxypropylene sorbitol ether or the like), a polyoxyalkylene condensate of ethylenediamine (ethylene diamine tetrapolyoxyethylene polyoxypropylene or the like), 2,2-bis(4-polyoxyalkylene-oxyphenyl)propane, polyoxyalkylene glyceryl ether, polyoxyalkylene diglyceryl ether, polyoxyalkylene trimethylolpropane ether, polyoxyalkylene pentaerythritol ether, and polyoxyalkylene methyl glucoside.

Examples of the polymer compound A having an amide group include polyvinylpyrrolidone and poly-N-vinylacetamide. The polymer compound A can have at least one selected from the group consisting of a primary amide group, a secondary amide group, and a tertiary amide group. The polymer compound A preferably contains a compound having a secondary amide group, from the viewpoint of easily obtaining excellent washability and an excellent polishing rate. The polymer compound A preferably contains a compound having a tertiary amide group, from the viewpoint of easily obtaining excellent washability and an excellent polishing rate.

The polymer compound A preferably contains a compound having a polyoxyalkylene structure. According to this, it is easier to form a protective layer on a surface to be polished to moderately adjust the polishing rate, and thus, excessive polishing of the concave portion is more easily suppressed, and therefore, it is easier to flatly finish a wafer after polishing. The number of carbon atoms of the oxyalkylene group (structural unit) in the polyoxyalkylene structure is preferably 1 or more, and more preferably 2 or more, from the viewpoint of easily obtaining excellent washability. The number of carbon atoms of the oxyalkylene group (structural unit) in the polyoxyalkylene structure is preferably 5 or less, more preferably 4 or less, and further preferably 3 or less, from the viewpoint of easily obtaining excellent washability. From these viewpoints, the number of carbon atoms is preferably 1 to 5. The polyoxyalkylene chain may be a homopolymer chain and it may be a copolymer chain. The copolymer chain may be a block polymer chain and it may be a random polymer chain.

The polymer compound A may satisfy at least one of properties described below, from the viewpoint of easily obtaining excellent washability. The number of the hydroxyl group of the polymer compound A may be 4 or less, may be 3 or less, or may be 1 or 2. The polymer compound A may be a chain compound. The polymer compound A may contain a homopolymer of a monomer having at least one selected from the group consisting of a hydroxyl group and an amide group. The polymer compound A may not have a structure unit derived from glucose. The polymer compound A may contain a compound having a hydroxyl group only at a side chain. The polymer compound A may contain a compound having a plurality of structure units having a hydroxyl group. The polymer compound A may contain a compound having two or more same structure units having a hydroxyl group. The polymer compound A may contain a compound having a plurality of structure units having an amide group. The polymer compound A may contain a compound having two or more same structure units having an amide group. The amide group in these structure units may be at least one selected from the group consisting of a primary amide group, a secondary amide group, and a tertiary amide group. The polymer compound A may contain a compound having a side chain containing an amide group, and may contain a compound having a main chain containing a carbon chain or a polyoxyalkylene chain and a side chain bonded to the main chain and containing an amide group. The polymer compound A may contain a compound having a main chain containing a hydroxyl group at both ends, and may contain a compound having a carbon chain or a polyoxyalkylene chain containing a hydroxyl group at both ends. As the "main chain", the longest molecular chain of molecular chains constituting the polymer compound can be used.

The polymer compound A preferably contains at least one selected from the group consisting of polyvinyl alcohol, polyalkylene glycol, polyvinylpyrrolidone, and poly-N-vinylacetamide, from the viewpoint of easily obtaining excellent washability. The polymer compound A preferably contains a polymer compound not having an aromatic group, from the viewpoint of easily obtaining excellent washability.

The lower limit of the weight average molecular weight of the polymer compound A is 3000 or more, from the viewpoint that washability of a polished surface after polishing is excellent (remaining of the abrasive grains on a polished surface after polishing is suppressed). The lower limit of the weight average molecular weight of the polymer compound A is preferably 4000 or more, more preferably 5000 or more, further preferably 6000 or more, particularly preferably 8000 or more, and extremely preferably 10000 or more, from the viewpoint of easily obtaining excellent washability. The upper limit of the weight average molecular weight of the polymer compound A is preferably 1000000 or less, more preferably 750000 or less, further preferably 500000 or less, particularly preferably 400000 or less, extremely preferably 200000 or less, highly preferably 100000 or less, even more preferably 50000 or less, more preferably 30000 or less, and further preferably 20000 or less, from the viewpoint of easily obtaining excellent washability. From these viewpoints, the weight average molecular weight of the polymer compound A is more preferably 3000 to 1000000.

In a case where the polymer compound A has a hydroxyl group, the lower limit of the weight average molecular weight of the polymer compound A is preferably in the following range in addition to the above-described weight average molecular weight range, from the viewpoint of easily obtaining excellent washability. The weight average molecular weight of the polymer compound A is preferably more than 10000, more preferably 12000 or more, further preferably 15000 or more, particularly preferably 18000 or more, and extremely preferably 20000 or more.

In a case where the polymer compound A has an amide group, the upper limit of the weight average molecular weight of the polymer compound A is preferably in the following range in addition to the above-described weight average molecular weight range, from the viewpoint of easily obtaining excellent washability. The weight average molecular weight of the polymer compound A is preferably 15000 or less, more preferably 12000 or less, and further preferably 10000 or less.

The weight average molecular weight of the polymer compound A can be measured, for example, by a gel permeation chromatography method (GPC) under the following conditions using a calibration curve of standard polystyrene.

Instrument used: Hitachi L-6000 Model [manufactured by Hitachi, Ltd.]
Column: Gel-Pak GL-R420+Gel-Pak GL-R430+Gel-Pak GL-R440 [manufactured by Hitachi Chemical Company, Ltd., trade names, three columns in total]
Eluent: tetrahydrofuran
Measurement temperature: 40° C.
Flow rate: 1.75 mL/min
Detector: L-3300RI [manufactured by Hitachi, Ltd.]

The content of the polymer compound A is preferably in the following range on the basis of the total mass of the polishing liquid. The lower limit of the content of the polymer compound A is preferably 0.01% by mass or more, more preferably 0.03% by mass or more, further preferably 0.05% by mass or more, particularly preferably 0.08% by mass or more, and extremely preferably 0.1% by mass or more, from the viewpoint of easily obtaining excellent washability. The lower limit of the content of the polymer compound A is preferably 0.2% by mass or more, more preferably 0.3% by mass or more, further preferably 0.4% by mass or more, and particularly preferably 0.5% by mass or more, from the viewpoint of easily obtaining an excellent polishing rate. The lower limit of the content of the polymer compound A is preferably 0.6% by mass or more, more preferably 0.8% by mass or more, and further preferably 1.0% by mass or more, from the viewpoint of easily obtaining particularly excellent washability. The upper limit of the content of the polymer compound A is preferably 5.0% by mass or less, more preferably 3.0% by mass or less, further preferably 2.0% by mass or less, and particularly preferably 1.0% by mass or less, from the viewpoint of easily obtaining excellent washability and an excellent polishing rate. From these viewpoints, the content of the polymer compound A is more preferably 0.01 to 5.0% by mass and further preferably 0.05 to 5.0% by mass.

The mass ratio of the content of the polymer compound A with respect to the content of the abrasive grains (the content of the polymer compound A/the content of the abrasive grains) is preferably in the following range. The lower limit of the mass ratio is preferably 0.1 or more, more preferably 0.3 or more, further preferably 0.5 or more, particularly preferably 0.8 or more, and extremely preferably 1 or more, from the viewpoint of easily obtaining excellent washability. The lower limit of the mass ratio is preferably 2 or more, more preferably 3 or more, further preferably 4 or more, and particularly preferably 5 or more, from the viewpoint of easily obtaining an excellent polishing rate. The lower limit of the mass ratio is preferably 6 or more, more preferably 8 or more, and further preferably 10 or more, from the viewpoint of easily obtaining particularly excellent washability. The upper limit of the mass ratio is preferably 50 or less, more preferably 30 or less, and further preferably 10 or less, from the viewpoint of easily obtaining excellent washability and an excellent polishing rate. From these viewpoints, the mass ratio is more preferably 0.1 to 50.

The mass ratio of the content of the polymer compound A with respect to the content of the hydroxy acid (the content of the polymer compound A/the content of the hydroxy acid) is preferably in the following range. The lower limit of the mass ratio is preferably 0.01 or more, more preferably 0.05 or more, further preferably 0.1 or more, particularly preferably 0.2 or more, and extremely preferably 0.25 or more, from the viewpoint of easily obtaining excellent washability. The lower limit of the mass ratio is preferably 0.3 or more, more preferably 0.5 or more, further preferably 1 or more, and particularly preferably 1.25 or more, from the viewpoint of easily obtaining an excellent polishing rate. The lower limit of the mass ratio is preferably 1.5 or more, more preferably 2 or more, and further preferably 2.5 or more, from the viewpoint of easily obtaining particularly excellent washability. The upper limit of the mass ratio is preferably 10 or less, more preferably 5 or less, and further preferably 2.5 or less, from the viewpoint of easily obtaining excellent washability and an excellent polishing rate. From these viewpoints, the mass ratio is more preferably 0.01 to 10.

[Arbitrary Additive]

The polishing liquid of the present embodiment may contain an arbitrary additive (excluding a compound corresponding to the hydroxy acid or the polymer compound A). Examples of the arbitrary additive include water-soluble polymers, oxidants (for example, hydrogen peroxide), and dispersants (for example, a phosphoric acid-based inorganic salt). Examples of the water-soluble polymer include polyacrylic acid-based polymers such as polyacrylic acid, a polyacrylic acid copolymer, polyacrylate, and a polyacrylic acid copolymer salt; and polymethacrylic acid-based polymers such as polymethacrylic acid and polymethacrylate.

(Liquid Medium)

The liquid medium in the polishing liquid of the present embodiment is not particularly limited, but is preferably water such as deionized water or ultrapure water. The content of the liquid medium may correspond to the remaining of the polishing liquid from which the contents of other constituent components are removed, and is not particularly limited.

(Properties of Polishing Liquid)

The lower limit of the pH of the polishing liquid of the present embodiment is preferably 2.0 or more, more preferably 2.5 or more, further preferably 3.0 or more, particularly preferably 3.2 or more, extremely preferably 3.4 or more, highly preferably 3.5 or more, even more preferably 4.0 or more, from the viewpoint of easily obtaining excellent washability (for example, the electrostatic attractive force between the abrasive grains and the insulating material is easily reduced by decreasing the absolute value of the positive zeta potential of the abrasive grains). The upper limit of the pH is preferably 8.0 or less, more preferably less than 8.0, further preferably 7.5 or less, particularly preferably 7.0 or less, extremely preferably 6.5 or less, highly preferably 6.0 or less, and even more preferably 5.0 or less, from the viewpoint of easily obtaining excellent washability. From these viewpoints, the pH of the polishing liquid is more preferably 2.0 to 8.0 and further preferably 2.0 to 7.0.

The pH may be less than 3.0, may be 2.8 or less, and may be 2.5 or less. The pH of the polishing liquid is defined as the pH at a liquid temperature of 25° C.

The pH of the polishing liquid can be adjusted by an acid component such as an inorganic acid or an organic acid; an alkali component such as ammonia, sodium hydroxide, tetramethylammonium hydroxide (TMAH), imidazole, alkanolamine, or a pyrazole (for example, 3,5-dimethylpyrazole); or the like. In order to stabilize the pH, a buffer may be added. A buffer solution (buffer-containing liquid) may be added as the buffer. Examples of such a buffer solution include an acetate buffer solution and a phthalate buffer solution.

The pH of the polishing liquid of the present embodiment can be measured by a pH meter (for example, Model No. PHL-40 manufactured by DKK-TOA CORPORATION). Specifically, for example, after performing 2-point calibration of the pH meter using a phthalate pH buffer solution (pH: 4.01) and a neutral phosphate pH buffer solution (pH: 6.86) as a standard buffer solution, an electrode of the pH meter is placed in the polishing liquid for 2 minutes or longer, and the value after stabilization is measured. The liquid temperature of both the standard buffer solution and the polishing liquid are set to 25° C.

The polishing liquid of the present embodiment may be stored as a one-pack type polishing liquid containing at least abrasive grains, the hydroxy acid, the polymer compound A, and a liquid medium, or as a multi-pack type (for example, two-pack type) polishing liquid set containing constituent components of the polishing liquid divided into a slurry (first liquid) and an additive liquid (second liquid) such that the slurry and additive liquid are mixed to form the polishing liquid. That is, the constituent components of the polishing liquid may be separately stored as the slurry and the additive liquid. The slurry contains, for example, at least abrasive grains and a liquid medium. The additive liquid contains, for example, at least the hydroxy acid, the polymer compound A, and a liquid medium. Between the slurry and the additive liquid, the hydroxy acid, the polymer compound A, an arbitrary additive, and a buffer are preferably contained in the additive liquid. Incidentally, the constituent components of the polishing liquid may be stored as a polishing liquid set divided into three or more liquids.

In the polishing liquid set, the slurry and the additive liquid are mixed immediately before polishing or during polishing to prepare the polishing liquid. Further, a one-pack type polishing liquid may be stored as a stock solution for a polishing liquid with a reduced liquid medium content and used by dilution with a liquid medium at the time of polishing. A multi-pack type polishing liquid set may be stored as a stock solution for a slurry and a stock solution for an additive liquid with reduced liquid medium contents, and used by dilution with a liquid medium at the time of polishing.

<Polishing Method>

The polishing method (the polishing method for a base substrate, or the like) of the present embodiment may include a polishing step of polishing a surface to be polished (a surface to be polished of the base substrate, or the like) by using the one-pack type polishing liquid or a polishing liquid obtained by mixing the slurry and the additive liquid of the polishing liquid set. The surface to be polished may contain an insulating material and may contain silicon oxide. The insulating material may have a negative zeta potential.

The lower limit of the polishing rate of an insulating material (for example, silicon oxide) is preferably 170 nm/min or more, more preferably 180 nm/min or more, further preferably 200 nm/min or more, particularly preferably 250 nm/min or more, and extremely preferably 270 nm/min or more.

According to the present embodiment, it is possible to provide use of a polishing liquid or a polishing liquid set in a polishing step of selectively polishing an insulating material with respect to a stopper material. Examples of the stopper material include silicon nitride and polysilicon.

The polishing method of the present embodiment may be a polishing method for a base substrate having an insulating material and silicon nitride, and may include, for example, a polishing step of selectively polishing the insulating material with respect to silicon nitride by using the one-pack type polishing liquid or a polishing liquid obtained by mixing the slurry and the additive liquid of the polishing liquid set. In this case, the base substrate may have, for example, a member containing an insulating material and a member containing silicon nitride.

The polishing method of the present embodiment may be a polishing method for a base substrate having an insulating material and polysilicon, and may include, for example, a polishing step of selectively polishing the insulating material with respect to polysilicon by using the one-pack type polishing liquid or a polishing liquid obtained by mixing the slurry and the additive liquid of the polishing liquid set. In this case, the base substrate may have, for example, a member containing an insulating material and a member containing polysilicon.

The polishing method of the present embodiment may be a polishing method for a base substrate having a first member containing a stopper material; and a second member containing an insulating material and also disposed on the first member. The polishing step may include a step of polishing the second member by using the one-pack type polishing liquid or a polishing liquid obtained by mixing the slurry and the additive liquid of the polishing liquid set, until the first member is exposed. The polishing step may include a step of polishing the first member and the second member by using the one-pack type polishing liquid or a polishing liquid obtained by mixing the slurry and the additive liquid of the polishing liquid set, after the first member is exposed.

The expression "selectively polishing a material A with respect to a material B" means that the polishing rate for the material A is higher than the polishing rate for the material B under the same polishing conditions. More specifically, the above expression means, for example, that the material A is polished with a polishing rate ratio of the polishing rate for the material A with respect to the polishing rate for the material B being 80 or more.

In the polishing step, for example, in a state where a material to be polished of the base substrate that has the material to be polished is pressed against a polishing pad (polishing cloth) of a polishing platen, the polishing liquid is supplied between the material to be polished and the polishing pad, and the base substrate and the polishing platen are moved relative to each other to polish the surface to be polished of the material to be polished. In the polishing step, for example, at least a part of a material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of a material to be polished include an insulating material (excluding a material corresponding to a stopper material) such as silicon oxide; and a stopper material such as polysilicon or silicon nitride. A material to be polished may be a single material or may be a plurality of materials. In a case where a plurality of materials are exposed on a surface to be polished, they can be considered as a material to be polished. A material to be polished may be in the form of a film (film to be polished) or may be a silicon oxide film, a polysilicon film, a silicon nitride film, or the like.

By polishing a material to be polished (for example, an insulating material such as silicon oxide) formed on such a substrate with the polishing liquid and removing an excess part, it is possible to eliminate irregularities on the surface of a material to be polished and to produce a smooth surface over the entire surface of the polished material. The polishing liquid of the present embodiment is preferably used for polishing a surface to be polished containing an insulating material. The polishing liquid of the present embodiment is preferably used for polishing a surface to be polished containing silicon oxide.

In the present embodiment, it is possible to polish an insulating material of a base substrate having an insulating material containing silicon oxide on at least the surface, a stopper (polishing stop layer) disposed as an underlayer of the insulating material, and a substrate (semiconductor substrate or the like) disposed under the stopper. The stopper material constituting the stopper is a material having a lower polishing rate than that for insulating material, and is preferably silicon nitride, polysilicon, or the like. In such a base substrate, by stopping polishing when the stopper is exposed, it is possible to prevent the insulating material from being excessively polished, and thus flatness of the insulating material after polishing can be improved.

Examples of a method for forming a material to be polished by the polishing liquid of the present embodiment include a CVD method such as a low-pressure CVD method, a normal-pressure CVD method, or a plasma CVD method; and a rotation application method in which a liquid raw material is applied to a rotating substrate.

Hereinafter, the polishing method of the present embodiment will be described by taking a polishing method for a base substrate (for example, a base substrate having an insulating material formed on a semiconductor substrate) as an example. In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, a polishing apparatus: Reflexion manufactured by Applied Materials, Inc. can be used.

As the polishing pad, common unwoven cloth, a foamed body, an unfoamed body, or the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, at least one selected from the group consisting of foamed polyurethane and unfoamed polyurethane is preferable from the viewpoint that a polishing rate and flatness are further excellent. It is preferable that the polishing pad is subjected to grooving so that the polishing liquid is pooled.

Polishing conditions are not particularly limited, but the upper limit of the rotation speed of a polishing platen is preferably 200 $min^{-1}$ ($min^{-1}$=rpm) or less such that the base substrate is not let out, and the upper limit of the polishing pressure (processing load) to be applied to the base substrate is preferably 15 psi (103 kPa) or less from the viewpoint of sufficiently suppressing the generation of polishing scratches. The polishing liquid is preferably continuously supplied to the polishing pad with a pump or the like during polishing. The amount supplied for this is not particularly limited, but it is preferable that the surface of the polishing pad is always covered with the polishing liquid.

The polishing method of the present embodiment may further include a washing step of bringing an alkali liquid (washing liquid) into contact with the polished surface, after the polishing step. In the washing step, an alkali liquid can be brought into contact with the polished surface to wash the polished surface. In the washing step, the abrasive grains adhering to the polished surface in the polishing step can be removed to wash the polished surface. As an alkali source of the alkali liquid, ammonia, TMAH (tetramethylammonium hydroxide), or the like can be used. In the washing step, hydrofluoric acid, an ammonia-hydrogen peroxide mixed liquid, a hydrochloric acid-hydrogen peroxide mixed liquid, a sulfuric acid-hydrogen peroxide mixed liquid, or the like may not be brought into contact with the polished surface.

In the washing step, a brush may be concurrently used in order to enhance washing efficiency. Further, it is preferable that, after washing, the water droplets adhering to the base substrate are removed off using a spin dryer or the like, and then the base substrate is dried.

The present embodiment can also be used in polishing of a pre-metal insulating material. Examples of the pre-metal insulating material include silicon oxide, phosphorus-silicate glass, boron-phosphorus-silicate glass, silicon oxyfluoride, and fluorinated amorphous carbon.

The present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic conductive materials such as ITO; and polymer resin materials such as polyimide-based, polybenzooxazole-based, acrylic, epoxy-based, and phenol-based materials.

The present embodiment can also be applied not only to film-like materials to be polished, but also to various types of substrates made of glass, silicon, SiC, SiGe, Ge, GaN, GaP, GaAs, sapphire, plastics, or the like.

The present embodiment can be used not only for production of semiconductor elements, but also for production of image display devices such as TFTs and organic ELs; optical parts such as photomasks, lenses, prisms, optical fibers, and single crystal scintillators; optical elements such as optical switching elements and optical waveguides; light-emitting elements such as solid lasers and blue laser LEDs; magnetic storage devices such as magnetic disks and magnetic heads; and the like.

EXAMPLES

Hereinafter, the present invention will be specifically described by means of Examples. However, the present invention is not limited to the following Examples.

<Preparation of Abrasive Grains>
(Preparation of Cerium Oxide Particles)

40 kg of commercially available cerium carbonate hydrate was placed in an alumina container and fired at 830° C. for 2 hours in air to obtain 20 kg of yellowish-white powder. This powder was subjected to phase identification by an X-ray diffraction method and it was confirmed that cerium oxide powder was obtained. 20 kg of cerium oxide powder thus obtained was subjected to dry pulverization using a jet mill to obtain cerium oxide powder containing cerium oxide particles.

(Preparation of Composite Particles)
[Preparation of Cerium Oxide Slurry]

The cerium oxide powder and trade name: ammonium dihydrogen phosphate (molecular weight: 97.99) manufactured by Wako Pure Chemical Industries, Ltd. were mixed to prepare a cerium oxide slurry (pH: 7) containing 5.0% by mass (solid content) of cerium oxide particles (first particles). The blending amount of the ammonium dihydrogen phosphate was adjusted to 1% by mass on the basis of the total amount of cerium oxide particles.

An adequate amount of the cerium oxide slurry was charged into trade name: MICROTRAC MT3300EXII manufactured by MicrotracBEL Corp., and the average particle diameter of the cerium oxide particles was measured. The displayed average particle diameter value was obtained as the average particle diameter (average secondary particle diameter). The average particle diameter of cerium oxide particles in the cerium oxide slurry was 145 nm.

An adequate amount of the cerium oxide slurry was charged into trade name: DelsaNano C manufactured by Beckman Coulter, Inc., and measurement was performed twice at 25° C. The average value of the displayed zeta potential was obtained as the zeta potential. The zeta potential of the cerium oxide particles in the cerium oxide slurry was −55 mV.

[Preparation of Cerium Hydroxide Slurry]

480 g of an aqueous 50% by mass $Ce(NH_4)_2(NO_3)_6$ solution (trade name: CAN50 liquid manufactured by Nihon Kagaku Sangyo Co., Ltd.) was mixed with 7450 g of pure water to obtain a solution. Next, while stirring this solution, 750 g of an aqueous imidazole solution (10% by mass aqueous solution, 1.47 mol/L) was added dropwise at a mixing rate of 5 mL/min to obtain a precipitate containing cerium hydroxide. The cerium hydroxide was synthesized at a temperature of 20° C. and a stirring speed of 500 min' The stirring was carried out using a 3-blade pitch paddle with a total blade section length of 5 cm.

The obtained precipitate (precipitate containing cerium hydroxide) was subjected to centrifugal separation (4000 min', for 5 minutes), and then subjected to solid-liquid separation with removal of a liquid phase by decantation. 10 g of particles obtained by solid-liquid separation and 990 g of water were mixed, and then the particles were dispersed in the water by using an ultrasonic cleaner to prepare a cerium hydroxide slurry (content of particles: 1.0% by mass) containing cerium hydroxide particles (second particles).

When the average particle diameter (average secondary particle diameter) of the cerium hydroxide particles in the cerium hydroxide slurry was measured using trade name: N5 manufactured by Beckman Coulter, Inc., a value of 10 nm was obtained. The measuring method was as follows. First, about 1 mL of a measuring sample (cerium hydroxide slurry, aqueous dispersion) containing 1.0% by mass of cerium hydroxide particles was introduced in a 1-cm square cell, and then the cell was set in the N5. Measurement was performed at 25° C. with the refractive index set to 1.333 and the viscosity set to 0.887 mPa·s as the measuring sample information of N5 software, and the value displayed as Unimodal Size Mean was read off.

An adequate amount of the cerium hydroxide slurry was charged into trade name: DelsaNano C manufactured by Beckman Coulter, Inc. and measurement was performed twice at 25° C. The average value of the displayed zeta potentials was obtained as the zeta potential. The zeta potential of cerium hydroxide particles in the cerium hydroxide slurry was +50 mV.

An adequate amount of the cerium hydroxide slurry was taken and vacuum dried to isolate the cerium hydroxide particles, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Further, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Further, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

<Measurement of Absorbance and Light Transmittance of Supernatant Solution>

The absorbance and the light transmittance provided by the abrasive grains used in Example 9 described below in the supernatant solution were measured.

While stirring at a rotation speed of 300 rpm using a stirring blade of two blades, the cerium hydroxide slurry and deionized water were mixed to obtain a mixed liquid. Subsequently, after mixing the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry (content of cerium oxide particles: 0.1% by mass, content of cerium hydroxide particles: 0.01% by mass) containing cerium hydroxide particles (free particles) that were not in contact with cerium oxide particles in addition to composite particles including cerium oxide particles and cerium hydroxide particles that were in contact with the cerium oxide particles was prepared.

The content of the abrasive grains (the total amount of particles) in the test slurry was adjusted (diluted with ion-exchange water) to 0.1% by mass to prepare a test liquid. 7.5 g of the test liquid was introduced in a centrifugal separator (trade name: Optima MAX-TL) manufactured by Beckman Coulter, Inc. and treated at a centrifugal acceleration of $5.8 \times 10^4$ G and at a setting temperature of 25° C. for 5 minutes to obtain a supernatant solution.

About 4 mL of the supernatant solution was introduced into a 1-cm square cell made of quartz, and then, the cell was placed in a spectrophotometer (device name: U3310) manufactured by Hitachi, Ltd. Measurement of the absorbance was performed in a wavelength range of 200 to 600 nm, and a value of the absorbance at a wavelength of 380 nm was read from a chart thus obtained. The absorbance was 0.002. Further, a value of the light transmittance at a wavelength of 500 nm was read from the chart thus obtained, and as a result, the value was 92%/cm or more.

<Preparation of Polishing Liquid for CMP>

Examples 1 to 8 and 10 to 13 and Comparative Examples 1 and 2

The cerium oxide powder (cerium oxide particles) and deionized water were mixed, and thereby a mixed liquid was obtained. Next, a hydroxy acid (not added in Comparative Example 2) and a polymer compound shown in Table 1 or Table 2, and a pH adjusting agent (3,5-dimethylpyrazole) were mixed in the mixed liquid. Then, a polishing liquid for CMP containing the polymer compound in a content shown in Table 1 or Table 2 in addition to 0.1% by mass of the cerium oxide particles, 0.4% by mass of the hydroxy acid, and 0.1% by mass of the pH adjusting agent on the basis of the total mass of the polishing liquid for CMP was obtained by performing dispersion under ultrasonication while stirring. The dispersion under ultrasonication was performed at an ultrasonic wave frequency of 400 kHz for a dispersion time of 30 minutes.

As a polyethylene glycol having a weight average molecular weight of 4000, trade name "Polyethylene glycol 4000" manufactured by Wako Pure Chemical Industries, Ltd. was used. As a polyethylene glycol having a weight average molecular weight of 20000, trade name "Polyethylene glycol 20000" manufactured by Wako Pure Chemical Industries, Ltd. was used. As polyvinyl alcohol, trade name "Polyvinyl alcohol" manufactured by Wako Pure Chemical Industries, Ltd. was used. As poly-N-vinylacetamide, trade name "Poly-N-vinylacetamide" manufactured by Showa Denko K.K. was used. As a polyvinylpyrrolidone having a weight average molecular weight of 10000, trade name "Polyvinylpyrrolidone (K15)" manufactured by Tokyo Chemical Industry Co., Ltd. was used. As a polyvinylpyrrolidone having a weight average molecular weight of 40000, trade name "Polyvinylpyrrolidone (K30)" manufactured by Tokyo Chemical Industry Co., Ltd. was used. As a polyvinylpyrrolidone having a weight average molecular weight of 360000, trade name "Polyvinylpyrrolidone (K90)" manufactured by Tokyo Chemical Industry Co., Ltd. was used. As a polyoxyethylene polyoxypropylene glyceryl ether having a weight average molecular weight of 2500, trade name "BLAUNON GEP-2500" manufactured by AOKI OIL INDUSTRIAL Co., Ltd. was used.

Example 9

While stirring at a rotation speed of 300 rpm using a stirring blade of two blades, 200 g of the cerium hydroxide slurry and 1400 g of deionized water were mixed to obtain a mixed liquid. Subsequently, after mixing 400 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Subsequently, a polymer compound (polyethylene glycol having a weight average molecular weight of 20000, trade name "Polyethylene glycol 20000" manufactured by Wako Pure Chemical Industries, Ltd.), 2,2-bis(hydroxymethyl)propionic acid, a pH adjusting agent (3,5-dimethylpyrazole), and deionized water were mixed. Thereby, a polishing liquid for CMP containing 0.1% by mass of the abrasive grains, 0.4% by mass of the hydroxy acid, 0.1% by mass of the polymer compound, and 0.1% by mass of the pH adjusting agent on the basis of the total mass of the polishing liquid for CMP was obtained. As the abrasive grains, the polishing liquid for CMP contained composite particles including cerium oxide particles and cerium hydroxide particles that were in contact with the cerium oxide particles, and the mass ratio between the cerium oxide particles and the cerium hydroxide particles was 10:1 (cerium oxide:cerium hydroxide). As the abrasive grains, the polishing liquid for CMP contained cerium hydroxide particles (free particles) that were not in contact with the cerium oxide particles, in addition to the above-described composite particles.

<Measurement of Zeta Potential of Abrasive Grains>

An adequate amount of the polishing liquid for CMP was charged into trade name: DelsaNano C manufacture by Beckman Coulter, Inc. and measurement was performed twice at 25° C. The average value of the displayed zeta potentials was obtained as the zeta potential. In both of Examples and Comparative Examples, the zeta potential of the abrasive grains was +50 mV.

<Measurement of Average Particle Diameter of Abrasive Grains>

An adequate amount of the above-described polishing liquid for CMP was respectively charged into trade name: MICROTRAC MT3300EXII manufactured by Microtrac-BEL Corp., and the average particle diameter of the abrasive grains was measured. The displayed average particle diameter value was obtained as the average particle diameter (average secondary particle diameter) of the abrasive grains. The average particle diameter was 145 nm in Examples 1-8 and 10-13 and Comparative Examples 1 and 2. The average particle diameter was 155 nm in Example 9.

<Measurement of pH of Polishing Liquid for CMP>

The pH of the polishing liquid for CMP was measured under the following conditions. The results are shown in Table 1 and Table 2.

Measurement temperature: 25° C.

Measurement apparatus: Model No. PHL-40 manufactured by DKK-TOA CORPORATION

Measurement method: After performing 2-point calibration using a standard buffer solution (phthalate pH buffer solution, pH: 4.01 (25° C.); neutral phosphate pH buffer solution, pH: 6.86 (25° C.)), an electrode was placed in the polishing liquid for CMP for 2 minutes or longer, and pH after stabilization was measured with the above-described measurement apparatus.

<CMP Evaluation>

The substrate to be polished was polished using the above-described polishing liquid for CMP under the following polishing conditions.

Polishing apparatus: Reflexion LK (manufactured by Applied Materials, Inc.)

Flow rate of polishing liquid for CMP: 250 mL/min
Substrate to be polished: Substrate to be polished having a silicon oxide film (TEOS film) on a silicon substrate Polishing pad: Product No. IC1010 manufactured by Rohm and Haas Japan K.K.

Polishing pressure: 3 psi

Number of rotations: Substrate to be polished/polishing platen=93/87 rpm

Polishing time: 1 min (60 seconds)

Washing of wafer: After a CMP treatment, washing was performed with water while applying an ultrasonic wave. Further, while allowing 0.25% by mass of ammonia water to flow, washing was performed using a brush for 45 seconds, and then drying was performed with a spin dryer.

(Washability Evaluation)

The number of defects of 0.15 μm or more remaining on the silicon oxide film that had been polished and washed under the above-described conditions (the number of remaining abrasive grains) was measured by using a defect measurement apparatus (trade name: Complus manufactured by Applied Materials, Inc.). Further, the rate of the number of defects of other Examples with respect to the number of defects of Comparative Example 1 (defect decrease rate) was calculated by the following formula. The results are shown in Table 1 and Table 2.

Defect decrease rate [%]=[(Number of defects of Comparative Example 1)−(Number of defects of Example)]/(Number of defects of Comparative Example 1)×100

(Polishing Rate Evaluation)

The polishing rate for a silicon oxide film ($SiO_2RR$) that had been polished and washed under the above-described conditions was obtained by the formula below. The film thickness difference of the silicon oxide film before and after polishing was obtained using a light interference type film thickness measuring apparatus (trade name: F80 manufactured by Filmetrics Japan, Inc.). The results are shown in Table 1 and Table 2.

Polishing rate=(Film thickness difference [nm] of silicon oxide film before and after polishing)/(polishing time: 1 [min])

TABLE 1

| | | Example | | | | | | | | |
|---|---|---|---|---|---|---|---|---|---|---|
| | | 1 | 2 | 3 | 4 | 5 | 6 | 7 | 8 | 9 |
| Abrasive grains | Type | Cerium oxide particles | | | | | | | Composite particles | |
| | Content (mass %) | | | | | 0.1 | | | | |
| Hydroxy acid | Type | 2,2-Bis (hydroxymethyl) propionic acid | 2-Hydroxyisobutyric acid | | 2,2-Bis (hydroxymethyl) propionic acid | | | | 2,2-Bis (hydroxymethyl) butyric acid | 2,2-Bis (hydroxymethyl) propionic acid |
| | Content (mass %) | 0.4 | 0.1 | | | | | 0.4 | | |
| Polymer compound | Type | | | Polyethylene glycol | | | | Polyvinyl alcohol | Polyethylene glycol | |
| | Weight average molecular weight | | | 4000 | | | | 20000 | 26000 | 20000 |
| | Content (mass %) | | 0.1 | | 0.1 | 0.5 | 1.0 | 0.1 | | 0.1 |
| pH | | 4.0 | 4.1 | 3.4 | 4.0 | 4.0 | 4.0 | 4.0 | 4.1 | 4.0 |
| Washability | Number of defects (number/wafer) | 74 | 168 | 211 | 22 | 25 | 18 | 50 | 36 | 45 |
| | Defect decrease rate (%) [vs Comparative Example 1] | 72.6 | 37.8 | 21.9 | 91.9 | 90.7 | 93.3 | 81.5 | 86.7 | 83.3 |
| Polishing rate (nm/min) | | 280 | 345 | 295 | 279 | 282 | 275 | 265 | 255 | 350 |

TABLE 2

| | | Example | | | | Comparative Example | |
|---|---|---|---|---|---|---|---|
| | | 10 | 11 | 12 | 13 | 1 | 2 |
| Abrasive grains | Type | Cerium oxide particles | | | | | |
| | Content (mass %) | 0.1 | | | | | |
| Hydroxy acid | Type | 2,2-Bis(hydroxymethyl)propionic acid | | | | | — |
| | Content (mass %) | 0.4 | | | | | — |
| Polymer compound | Type | Poly-N-vinylacetamide | Polyvinylpyrrolidone | | | Polyoxyethylene polyoxypropylene glyceryl ether | Polyethylene glycol |
| | Weight average molecular weight | 500000 | 10000 | 40000 | 360000 | 2500 | 20000 |
| | Content (mass %) | 0.1 | | | | | |
| pH | | 4.0 | 4.0 | 4.0 | 4.0 | 4.0 | 6.1 |
| Washability | Number of defects (number/wafer) | 85 | 52 | 99 | 165 | 270 | 1471 |
| | Defect decrease rate (%) [vs Comparative Example 1] | 68.5 | 80.7 | 63.3 | 38.9 | 0.0 | Increased |
| Polishing rate (nm/min) | | 315 | 297 | 256 | 180 | 268 | 160 |

The invention claimed is:

1. A polishing liquid comprising: abrasive grains; a hydroxy acid component comprising a hydroxy acid having one carboxyl group and one to three hydroxyl groups; a polymer component comprising a polymer compound having at least one selected from the group consisting of a hydroxyl group and an amide group; and a liquid medium, wherein
a zeta potential of the abrasive grains is positive,
the abrasive grains include a property of producing a liquid phase having an absorbance of more than 0 for light having a wavelength of 380 nm when an aqueous dispersion having a content of the abrasive grains adjusted to 1.0% by mass is subjected to centrifugal separation at a centrifugal acceleration of $5.8 \times 10^4$ G for 5 minutes, and
a weight average molecular weight of the polymer compound is 3000 or more.

2. The polishing liquid according to claim 1, wherein the abrasive grains contain a cerium oxide.

3. The polishing liquid according to claim 1, wherein the number of the hydroxyl groups of the hydroxy acid is 2.

4. The polishing liquid according to claim 1, wherein a content of the hydroxy acid component is 0.01 to 1.0% by mass.

5. The polishing liquid according to claim 1, wherein the polymer component comprises a compound having a polyoxyalkylene structure.

6. The polishing liquid according to claim 1, wherein the polymer component comprises a compound having two or more same structure units having a hydroxyl group.

7. The polishing liquid according to claim 1, wherein the polymer component comprises a compound having a secondary amide group.

8. The polishing liquid according to claim 1, wherein the polymer component comprises a compound having a tertiary amide group.

9. The polishing liquid according to claim 1, wherein the polymer component comprises a compound having a side chain containing an amide group.

10. The polishing liquid according to claim 1, wherein the polymer component comprises a compound having a main chain containing a hydroxyl group at both ends.

11. The polishing liquid according to claim 1, wherein a content of the polymer component is 0.01 to 5.0% by mass.

12. The polishing liquid according to claim 1, wherein a pH is less than 8.0.

13. The polishing liquid according to claim 1, wherein the number of the hydroxyl groups of the hydroxy acid is 2,
the polymer component comprises a compound having a main chain containing a hydroxyl group at both ends, and
a pH is 8.0 or less.

14. The polishing liquid according to claim 1, wherein the hydroxy acid component comprises one or more of 2,2-bis(hydroxymethyl)propionic acid, 2,2-bis(hydroxymethyl)butyric acid, and 2-hydroxyisobutyric acid.

15. The polishing liquid according to claim 1, wherein the absorbance is more than 0 and 0.5 or less.

16. The polishing liquid according to claim 1, wherein the abrasive grains include a property of producing a liquid phase having a light transmittance of 50%/cm or more for light having a wavelength of 500 nm when an aqueous dispersion having a content of the abrasive grains adjusted to 1.0% by mass is subjected to centrifugal separation at a centrifugal acceleration of $5.8 \times 10^4$ G for 5 minutes.

17. The polishing liquid according to claim 1, wherein the abrasive grains include composite particles comprising first particles and second particles in contact with the first particles,
a particle diameter of the second particles is smaller than a particle diameter of the first particles,
the first particles contain a cerium oxide, and
the second particles contain a cerium compound.

18. The polishing liquid according to claim 17, wherein the cerium compound is a compound different from a cerium oxide.

19. The polishing liquid according to claim 17, wherein the cerium compound comprises a hydroxide of tetravalent cerium.

20. The polishing liquid according to claim 19, wherein the abrasive grains further comprise free particles not contacting the composite particles, and a particle diameter of the free particles is smaller than a particle diameter of the composite particles.

21. A polishing liquid set comprising:
constituent components of the polishing liquid according to claim 1, separately stored as a first liquid and a second liquid, wherein
the first liquid contains the abrasive grains and the liquid medium, and
the second liquid contains the hydroxy acid component, the polymer component, and the liquid medium.

22. A polishing method comprising a polishing step of polishing a surface to be polished by using a polishing liquid obtained by mixing the first liquid and the second liquid of the polishing liquid set according to claim 21.

23. The polishing method according to claim 22, wherein the surface to be polished contains silicon oxide.

24. The polishing method according to claim 22, further comprising a step of bringing an alkali liquid into contact with the polished surface after the polishing step.

25. A polishing method comprising a polishing step of polishing a surface to be polished by using the polishing liquid according to claim 1.

26. The polishing method according to claim 25, wherein the surface to be polished contains silicon oxide.

27. The polishing method according to claim 25, further comprising a step of bringing an alkali liquid into contact with the polished surface after the polishing step.

28. A polishing liquid comprising: abrasive grains; a hydroxy acid component comprising a hydroxy acid having one carboxyl group and one to three hydroxyl groups; a polymer component comprising a polymer compound having at least one selected from the group consisting of a hydroxyl group and an amide group; and a liquid medium, wherein
the abrasive grains include composite particles and free particles not contacting the composite particles, the composite particles comprise first particles and second particles in contact with the first particles,
the first particles contain a cerium oxide,
the second particles comprise a hydroxide of tetravalent cerium,
the free particles comprise a hydroxide of tetravalent cerium,
a particle diameter of the second particles is smaller than a particle diameter of the first particles, and a particle diameter of the free particles is smaller than a particle diameter of the composite particles,
a zeta potential of the abrasive grains is positive,
the abrasive grains include a property of producing a liquid phase having an absorbance of more than 0 for light having a wavelength of 380 nm when an aqueous dispersion having a content of the abrasive grains adjusted to 1.0% by mass is subjected to centrifugal separation at a centrifugal acceleration of $5.8 \times 10^4$ G for 5 minutes, and a weight average molecular weight of the polymer compound is 3000 or more.

29. The polishing liquid according to claim 28, wherein the liquid phase comprises the free particles but not the composite particles.

* * * * *